United States Patent
Dray et al.

(10) Patent No.: US 9,735,772 B2
(45) Date of Patent: Aug. 15, 2017

(54) MULTI-ORIENTATION INTEGRATED CELL, IN PARTICULAR INPUT/OUTPUT CELL OF AN INTEGRATED CIRCUIT

(71) Applicants: STMICROELECTRONICS SA, Montrouge (FR); STMICROELECTRONICS (CROLLES 2) SAS, Crolles (FR)

(72) Inventors: Alexandre Dray, Crolles (FR); Emmanuel Josse, La Motte Servolex (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 54 days.

(21) Appl. No.: 14/865,618

(22) Filed: Sep. 25, 2015

(65) Prior Publication Data
US 2016/0134282 A1   May 12, 2016

(30) Foreign Application Priority Data
Nov. 12, 2014 (FR) ..................................... 14 60877

(51) Int. Cl.
| H01L 25/00 | (2006.01) |
| H03K 17/687 | (2006.01) |
| H01L 21/66 | (2006.01) |
| G01R 31/28 | (2006.01) |
| H01L 27/02 | (2006.01) |

(52) U.S. Cl.
CPC ....... H03K 17/687 (2013.01); G01R 31/2884 (2013.01); H01L 22/22 (2013.01); H01L 22/34 (2013.01); H01L 27/0207 (2013.01)

(58) Field of Classification Search
CPC ......... H01L 27/0207; H01L 2924/3011; H01L 27/11898; H01L 23/50
USPC .................................. 327/565–566, 407–408
See application file for complete search history.

(56) References Cited

U.S. PATENT DOCUMENTS

| 4,636,979 | A |   | 1/1987 | Donoghue |
| 7,312,485 | B2 | * | 12/2007 | Armstrong ...... H01L 21/823807 257/254 |
| 8,284,583 | B2 | * | 10/2012 | Takahashi .............. G11C 5/025 365/214 |

(Continued)

FOREIGN PATENT DOCUMENTS

JP           20062697         10/2006

Primary Examiner — Quan Tra
(74) Attorney, Agent, or Firm — Slater Matsil, LLP

(57) ABSTRACT

An integrated circuit includes at least one integrated cell disposed at a location of the integrated circuit. The at least one integrated cell may have two integrated devices coupled to at least one site of the integrated cell and a multiplexer, and the two integrated devices respectively oriented in two different directions of orientation. A first integrated device of the two integrated devices that is oriented in one of the two directions of orientation is usable. The integrated circuit may include a controller configured to detect the direction of orientation which, having regard to the disposition of the integrated cell at the location, may allow the first integrated device to be usable, and to control the multiplexer to couple the first integrated device electrically to the at least one site.

17 Claims, 9 Drawing Sheets

(56) References Cited

U.S. PATENT DOCUMENTS

| | | | |
|---|---|---|---|
| 2002/0186592 A1* | 12/2002 | Pagliato | G11C 11/56 365/185.21 |
| 2006/0286754 A1 | 12/2006 | Hosomi | |
| 2008/0121948 A1* | 5/2008 | Kim | G06F 17/5063 257/255 |
| 2009/0014806 A1* | 1/2009 | Ostermayr | H01L 21/823807 257/369 |
| 2009/0206821 A1 | 8/2009 | Meterelliyoz et al. | |
| 2011/0215862 A1* | 9/2011 | La Rosa | G05F 3/24 327/541 |

* cited by examiner

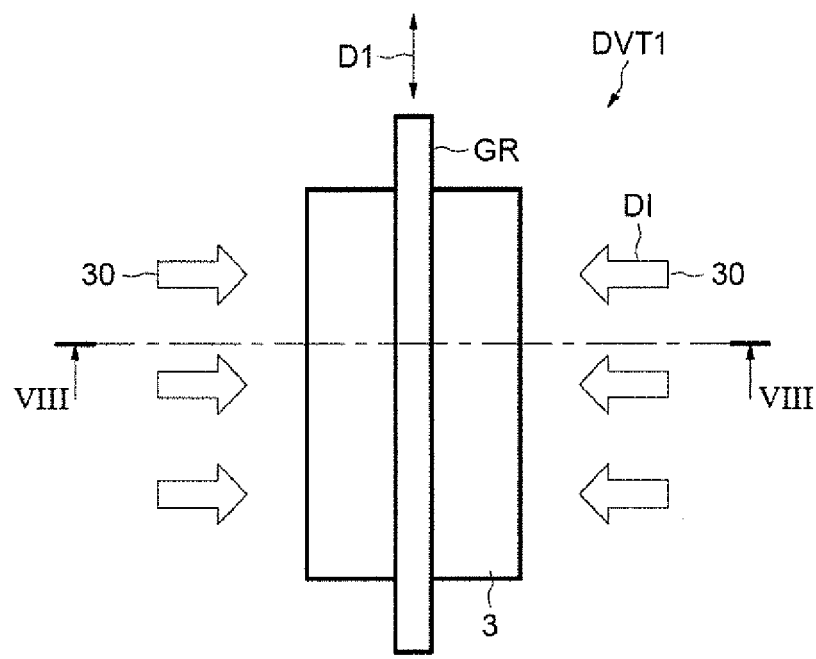
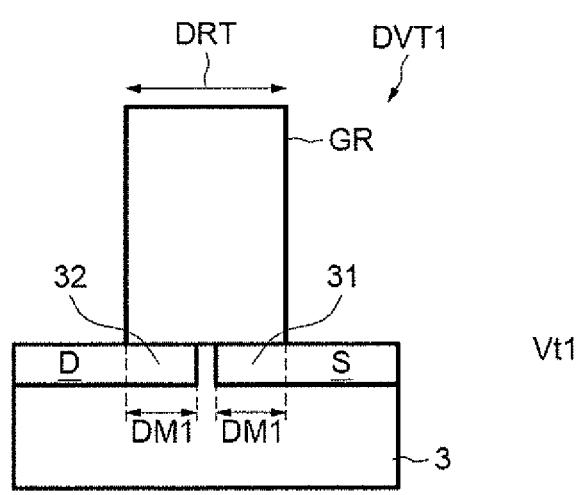

MULTI-ORIENTATION INTEGRATED CELL, IN PARTICULAR INPUT/OUTPUT CELL OF AN INTEGRATED CIRCUIT

FIELD

Embodiments of the invention relate to integrated circuits, and more particularly cells of such a circuit. For example, input/output cells that are able to take various orientations on the integrated circuit as a function of their location and containing components, for example, but not limited to, thin gate oxide MOS transistors.

BACKGROUND

In 28 nanometer (nm) CMOS technologies and above, the orientation of the gates of the transistors on the semiconducting substrate in several directions is possible, in particular in a vertical direction or in a horizontal direction.

On the other hand, in CMOS technologies below 28 nm, the orientation of certain components on the substrate may become critical since such components may, for example, be used only in a single direction. This is the case for example with thin gate oxide MOS transistors typically having an oxide thickness of less than or equal to 2 nm. Typically, such transistors have a vertical gate orientation on the substrate, that is to say perpendicular to an oblique direction of implantation performed in a direction of implantation in such a way as to form doped source and drain zones (commonly designated by the person skilled in the art by the term "Halo" or "pocket") under the gate of these transistors.

Indeed, lithography and technology constraints may prohibit the use of such transistors in a horizontal direction. Other components remain multi-orientation however. This is the case, for example, with thick gate oxide MOS transistors, typically having a gate oxide thickness of greater than or equal to 3 nm with sufficient gate dimensions measured length-wise along the channel (drain—source distance) of, for example, greater than or equal to 150 nm.

However, in an integrated circuit, certain cells may be disposed according to different orientations as a function of their location on the integrated circuit.

This is the case, for example, with the input/output cells which are generally disposed within a rectangular annulus around the core of the integrated circuit.

Also, typically, as a function of the location of an input/output cell in another branch of the rectangular annulus, certain components, such as, for example thin gate oxide MOS transistors, may then exhibit a vertical orientation or else a horizontal orientation. The transistors exhibiting a horizontal orientation typically must consequently undergo a rotation to again exhibit a vertical gate orientation.

Hence, an approach includes developing, for these advanced technologies, two libraries of cells containing orientation-sensitive components.

Also, the cells of the first library are, for example, intended to be placed in a horizontal branch of the input/output cell annulus so that the thin gate oxide transistors, for example, are vertically oriented.

The homologous cells of the other library are then intended to be disposed in a vertical branch of the annulus so that once again the thin gate oxide transistors exhibit a vertical gate orientation.

That said, not only does such an approach require the development and the qualification of two libraries of cells, but furthermore the designer typically must each time analyze the location of the cell on the integrated circuit so as to extract the corresponding cell from one or the other of the libraries, with the potential risk of errors.

SUMMARY

According to one embodiment, it is proposed, for cells comprising orientation-sensitive components, to develop only a single library of cells that are capable of being disposed at any site of the integrated circuit, for example, of an annulus of input/output cells, while on each occasion providing that the orientation-sensitive components, for example thin gate oxide transistors, having a correct orientation are actually electrically functional.

According to one aspect, there is proposed an integrated circuit comprising at least one integrated cell, for example an input/output cell, disposed at a location of the integrated circuit, for example, in a branch of a rectangular annulus of input/output cells. That said, such an integrated cell may also be a so-called "cluster" input/output cell according to terminology used by the person skilled in the art, that is to say placed directly at a location of the core of the integrated circuit with any a priori orientation.

The at least one integrated cell comprises two first integrated devices, for example, thin gate oxide MOS transistors, connected to at least one site of the cell by way of a multiplexer and respectively oriented in two different directions of orientation, only the first device oriented in one of these directions of orientation being usable.

The cell moreover comprises a controller configured so as to detect that one of the directions of orientation which, having regard to the direction of the cell at the location, allows the corresponding first device to be usable, and so as to control the multiplexer in such a way as to actually connect the first usable device electrically to the at least one site.

A usable device is in particular a device exhibiting a normal, that is to say non-degraded, operating state.

According to one embodiment, the controller includes a detection circuit comprising two integrated test devices respectively oriented in the two directions of orientation, each test device comprising an element exhibiting a different characteristic according to the direction of orientation and representative of the usable or non-usable character of a first device. This element may be, for example, a doped zone possessing a part extending under the gate of the transistor, the characteristic then being the dimension of the part measured length-wise along the channel, or else the element can be the gate of a test transistor, the characteristic then being the roughness of the gate. A detector may be configured to analyze the characteristics of the elements of the two test devices and deliver a control signal for the multiplexer.

In practice, according to an embodiment, the detector is advantageously configured to analyze the characteristics of the elements on the basis of an electrical parameter of the test devices, for example, the threshold voltage or the leakage current of a transistor.

According to another embodiment, the two integrated test devices are different from a first device and usable in the two directions of orientation. These two test devices can thus be thick gate oxide transistors.

According to another possible embodiment of the invention, the two integrated test devices are analogous to a first device. Stated otherwise, the two integrated test devices can also be, for example, thin gate oxide transistors.

The two directions of orientation are for example orthogonal, typically vertical and horizontal.

According to another embodiment, each first device is a thin gate oxide MOS transistor, with the longitudinal direction of the gate, that is to say the direction perpendicular to the length of the channel, defining the direction of orientation of the MOS transistor.

According to another embodiment, each test device is a thick gate oxide MOS transistor, with the longitudinal direction of the gate defining the direction of orientation of the MOS transistor. The element is a doped zone possessing a part extending under the gate of the transistor, with the characteristic being the dimension of the part measured in the direction of the length of the channel.

The electrical parameter is then advantageously the threshold voltage of each test transistor, and the detector is advantageously configured to detect that one of the test transistors, which exhibits the highest threshold voltage, and to deliver to the multiplexer a control signal selecting the thin gate oxide MOS transistor having the same direction of orientation as that of the test transistor exhibiting the highest threshold voltage.

According to another embodiment, each integrated test device is a first device and the element is then, for example, the gate of the test transistor, with the characteristic being the roughness of this gate.

The electrical parameter is then advantageously the leakage current of each test transistor, and the detector is configured to detect one of the test transistors which exhibits the smallest leakage current, and to deliver to the multiplexer a control signal selecting the thin gate oxide MOS transistor having the same direction of orientation as that of the test transistor exhibiting the smallest leakage current.

According to another embodiment, the integrated circuit can also include a rectangular annulus comprising several integrated cells forming input/output cells of the integrated circuit.

BRIEF DESCRIPTION OF THE DRAWINGS

Other advantages and characteristics of the invention will be apparent on examining the detailed description of wholly non-limiting embodiments and the appended drawings, in which:

FIG. 7 is a schematic of a multi-orientated thick gate oxide MOS transistor;

FIG. 8 is a schematic transverse sectional view along the line VIII-VIII of FIG. 7;

DETAILED DESCRIPTION

Figure 1:
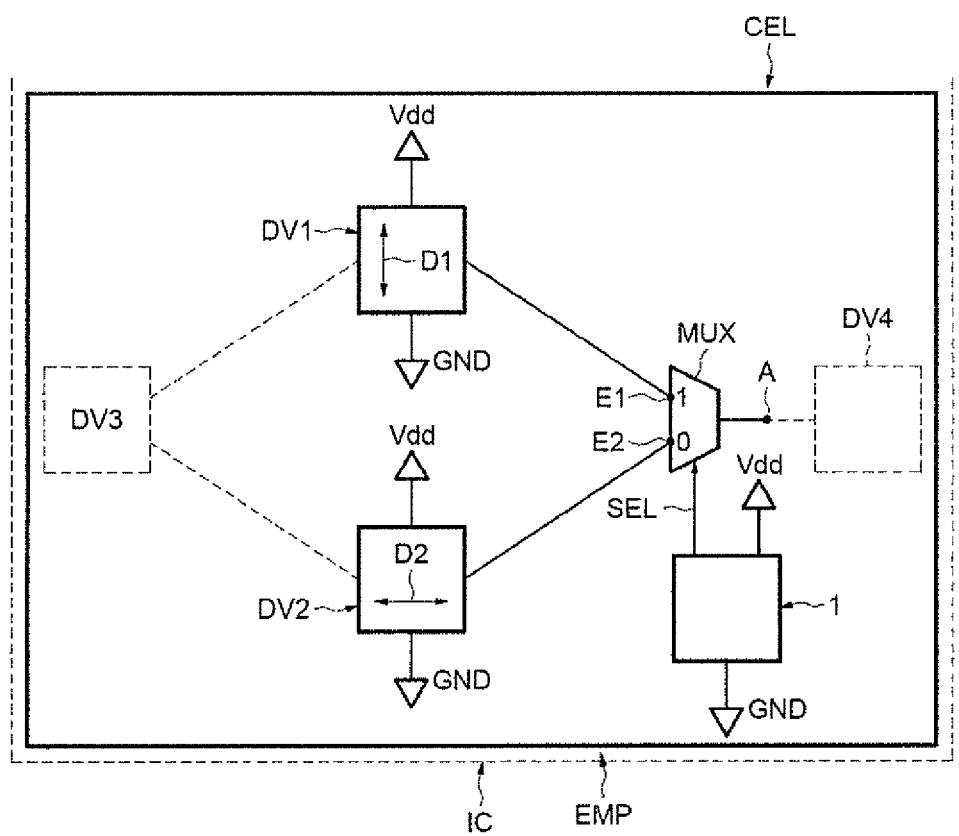
FIG. 1 is a block diagram of an integrated cell according to an embodiment of the invention.

In FIG. 1, the reference CEL designates an integrated cell disposed at a location EMP of an integrated circuit IC. This cell CEL is, for example, an input/output cell although this example is not limiting.

The cell CEL comprises two first integrated devices DV1, DV2, for example thin gate oxide MOS transistors having an oxide thickness of less than or equal to 2 nm.

The first device DV1 is oriented in the direction D1 while the first device DV2 is oriented in the direction D2. These two directions are orthogonal.

Each device is supplied between a supply voltage Vdd and ground GND.

When the device DV1 or DV2 is a thin gate oxide MOS transistor, the orientation D1 or D2 corresponds to the orientation of the gate, that is to say its longitudinal direction, that is to say its direction measured perpendicularly to the length of the channel (drain—source distance).

The two first devices DV1 and DV2 are connected to a site A of the cell CEL by way of a multiplexer MUX controlled by a control signal SEL which, as a function of the logic state 1 or 0, will control the multiplexer MUX in such a way that the input E1 is actually connected electrically to the site A or that the input E2 is actually connected electrically to the site A.

The control signal SEL is delivered by a controller 1, which is configured to detect those of the directions of orientation D1 or D2 which, having regard to the disposition of the cell at the location EMP, allows the corresponding first device DV1 or DV2 to be usable.

Of course, as illustrated by a dashed line in FIG. 1, the cell CEL may comprise other integrated devices such as, for example, devices DV3 and DV4, which may be multi-orientation devices, that is to say not sensitive to a particular direction of orientation. By way of indication, these devices DV3 and DV4 can comprise thick gate oxide MOS transistors, having an oxide thickness of typically greater than or equal to 3 nm and having gate lengths (dimensions measured in the channel direction) of typically greater than or equal to 150 nm, for example equal to 150 nm.

Figure 2:
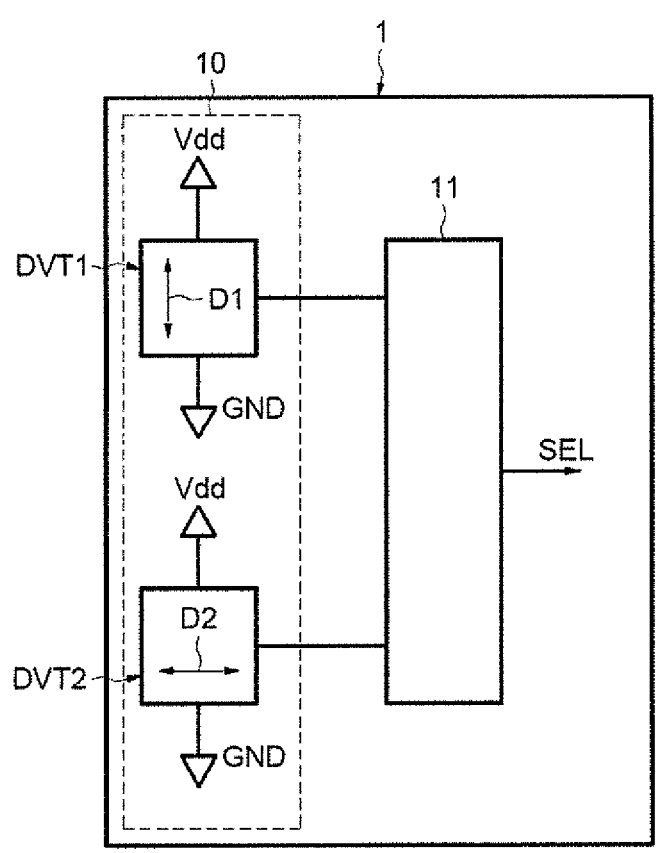
FIG. 2 is a block diagram of a controller of the integrated circuit.

In FIG. 2, it is seen that the controller 1 comprises a detection circuit 10 comprising two integrated test devices DVT1 and DVT2 respectively oriented in the two directions of orientation D1 and D2.

As will be seen in greater detail hereinafter, each test device comprises an element exhibiting a different characteristic according to the direction of orientation and representative of the usable or non-usable character of a first device (for example a thin gate oxide MOS transistor).

The controller 1 also comprises a detector 11 configured to analyze the characteristics of the elements of the two test devices DVT1 and DVT2 and deliver the control signal SEL for the multiplexer so as to select that one of the two first devices DV1 and DV2 which will be usable having regard to the disposition of the cell at the location EMP.

In practice, as will be seen in greater detail hereinafter, the detector 11 is configured to analyze the characteristics of the elements on the basis of an electrical parameter of the test devices DVT1 and DVT2.

Figure 3:
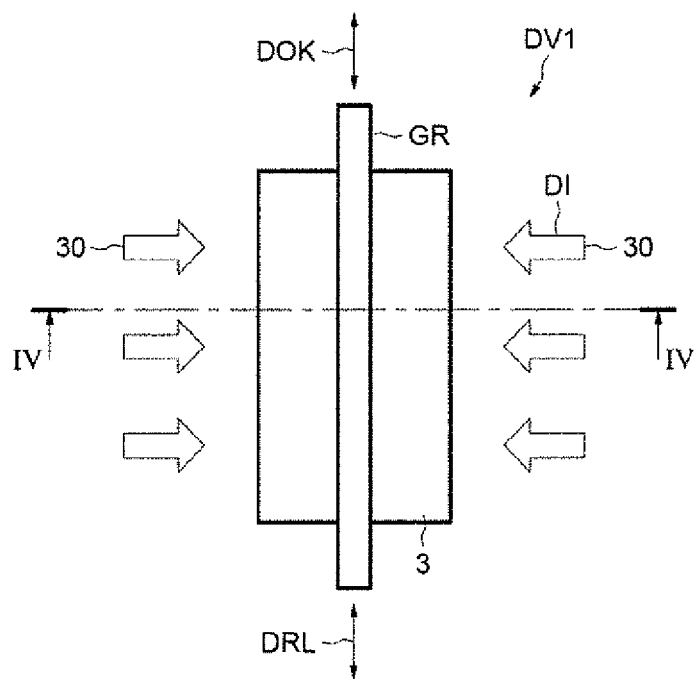
FIG. 3 is a schematic of a thin gate oxide MOS transistor.
Figure 4:
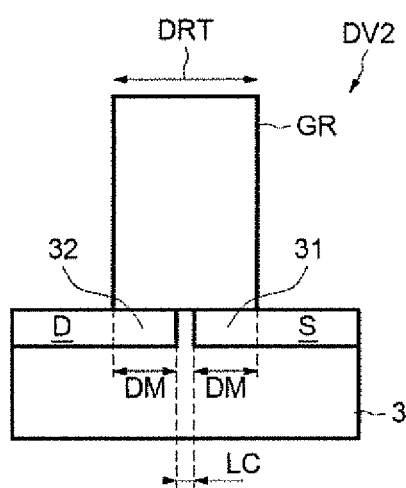
FIG. 4 is a schematic transverse sectional view along the line IV-IV of FIG. 3.

In FIG. 3 and in FIG. 4, which is a transverse section along the line IV-IV of FIG. 3, the device DV1 is a thin gate oxide MOS transistor.

Figure 5:
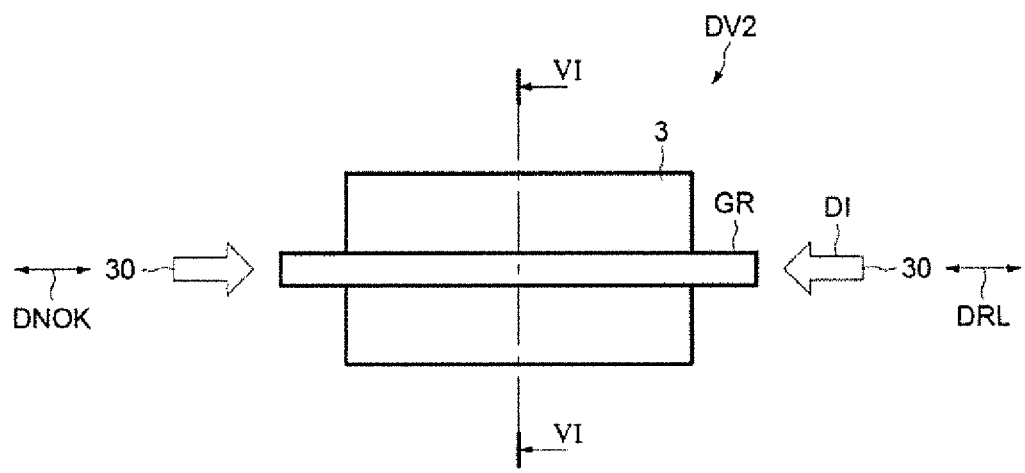
FIG. 5 is a schematic of a thin gate oxide MOS transistor.
Figure 6:
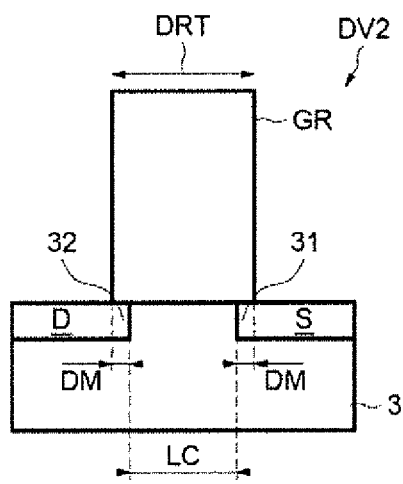
FIG. 6 is a schematic transverse sectional view along the line VI-VI of FIG. 5.

Likewise, as illustrated in FIG. 5 and in FIG. 6, which is a transverse section along the line VI-VI of FIG. 5, the device DV2 is also a thin gate oxide MOS transistor.

As illustrated in FIG. 3, the transistor DV1 comprises above an active zone made in a semiconducting substrate 3, a gate GR, for example a poly-silicon line, electrically insulated from the active zone by a gate oxide, and oriented in the longitudinal direction DRL, which corresponds to a direction of orientation DOK, typically a vertical direction, for which the transistor is usable, that is to say exhibiting normal operation.

Indeed, as illustrated in FIG. 3, a conventional step of fabricating a thin oxide transistor such as this comprises a dual oblique implantation 30 of dopants in a direction of implantation DI, doing so in both senses of this direction so as to form, as illustrated in FIG. 4, source and drain zones comprising parts 31 and 32 extending under the gate GR in the transverse direction DRT. These zones 31 and 32 are commonly designated by the person skilled in the art by the name "Halo" or "pocket".

These zones 31 and 32 have a dimension DM, measured in the transverse direction DRT, and define the length LC of the channel of the transistor.

In FIG. 5, the device DV2 is oriented in the direction DRL, which is here a horizontal direction and which is considered to be a direction of orientation DNOK leading to a device DV2, which is unusable since it exhibits degraded operation with respect to the normal operation of the device.

Indeed, as seen in FIG. 5, the direction of orientation DRL or DNOK of the device DV2 is parallel to the direction of implantation DI.

This therefore results, as illustrated in FIG. 6, in zones 31 and 32 exhibiting a very small, or indeed zero, dimension DM, which is in any event much less than the dimension DM of a transistor of FIG. 4.

Whereas in FIGS. 2 to 6, the direction of orientation D1 is considered to be the direction DOK, that is to say that leading to a usable character of the thin gate oxide transistor and that the direction D2 is considered to be the direction DNOK leading to an unusable transistor since it exhibits degraded operation, the direction D1 could be as a function of the location of the cell within the integrated circuit and its disposition, the direction DNOK and the direction D2 the direction DOK.

In FIG. 7 and FIG. 8, which is a transverse section along the line VIII-VIII of FIG. 7, the integrated test device DVT1 is a multi-orientation thick gate oxide MOS transistor.

Figure 9:
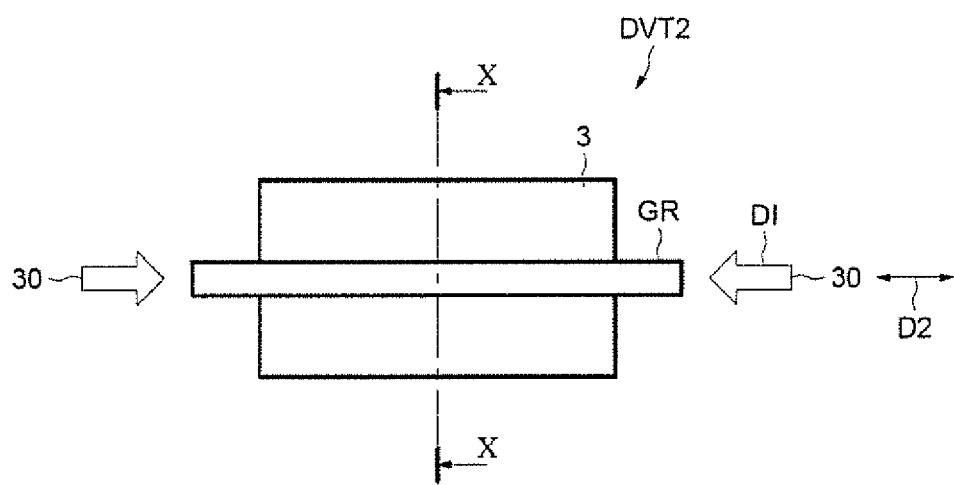
FIG. 9 is a schematic of a multi-orientation thick gate oxide MOS transistor.
Figure 10:
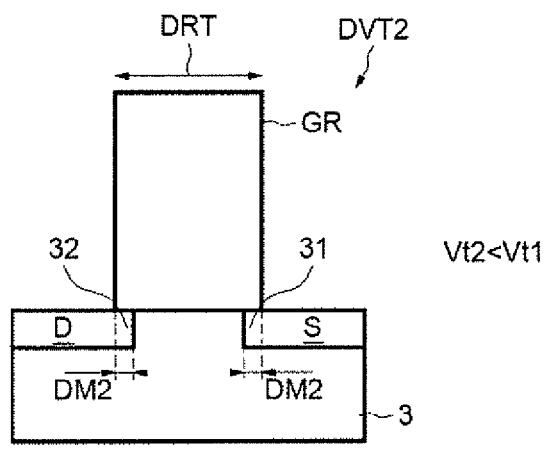
FIG. 10 is a schematic transverse sectional view along the line X-X of FIG. 9.

Likewise, as illustrated in FIG. 9 and in FIG. 10 which is a transverse section along the line X-X of FIG. 9, the test device DVT2 is also a multi-orientation thick gate oxide MOS transistor.

In general, the methods for fabricating a thick gate oxide transistor provide for an implantation tilted in two orthogonal directions and in both senses for each direction.

Stated otherwise, East-West-South and North implantations of dopants are undertaken for these thick gate oxide transistors in such a way as to produce the so-called "Halo" or "pocket" zones.

That said, when thick gate oxide transistors such as these are used as test transistors, the oblique implantation in the two orthogonal directions is replaced, by a dual oblique implantation analogous to that performed for producing the thin gate oxide transistors and performed in the direction of implantation DI.

Thus, as illustrated in FIG. 8, when the test transistor DVT1 is oriented in the direction D1 perpendicular to the direction of implantation DI, we obtain the zones 31 and 32 extending amply under the gate GR and having dimensions DM1 measured in the sense of the transverse direction DRT.

Such a test transistor DVT1 then exhibits a threshold voltage Vt1.

On the other hand, as illustrated in FIG. 9, when the dual implantation 30 is undertaken in the direction of implantation DI on the transistor DVT2 oriented in the direction D2, we obtain, as illustrated in FIG. 10, zones 31 and 32 having a very small, or indeed zero, dimension DM2, which is in any event less than the dimension DM1.

The threshold voltage Vt2 of the transistor DVT2 is then less than the threshold voltage Vt1 of the test transistor DVT1.

The detector 11 will then use this electrical parameter (threshold voltage) to determine which of the devices DV1 and DV2 is oriented in the appropriate direction DOK and control the multiplexer accordingly.

Figure 11:
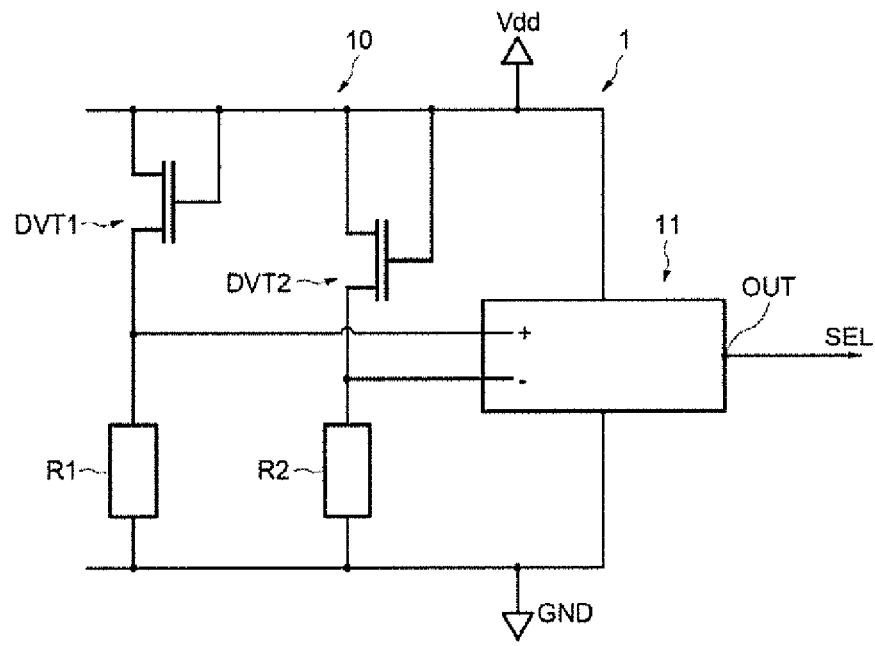
FIG. 11 is a schematic of the controller.

More precisely, as illustrated in FIG. 11, the detection circuit 10 comprises the two test transistors DVT1 and DVT2 connected between the supply voltage Vdd and ground GND, the gate and the drain of each transistor DVT1 being linked to the voltage Vdd while the source is linked to ground GND by way of the resistors R1 and R2.

The sources of the two transistors are linked to the + and − inputs of a comparator 11 whose output OUT delivers the signal SEL.

Figure 12:
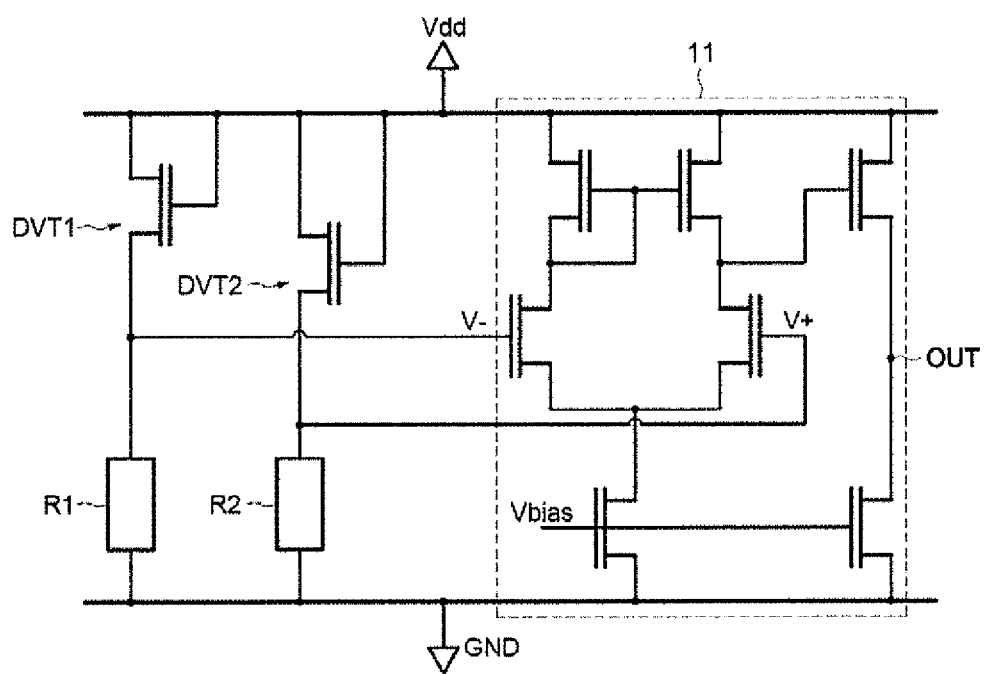
FIG. 12 is a schematic of a comparator of the controller of FIG. 11.

By way of nonlimiting example, the comparator 11 is, as illustrated in FIG. 12, based on an operational amplifier with differential structure with two stages having a bias voltage Vbias.

Thus, if the threshold voltage Vt2 of the transistor DVT2 is greater than the threshold voltage Vt1 of the transistor DVT1, then the output voltage of the comparator will be in the high state leading to the 1 logic state of the signal SEL.

If on the other hand the threshold voltage Vt1 of the test transistor DVT1 is greater than the test voltage Vt2 of the test transistor DVT2, then the output voltage of the comparator 11 will be in the low state leading to a 0 logic level of the signal SEL.

Figure 13:
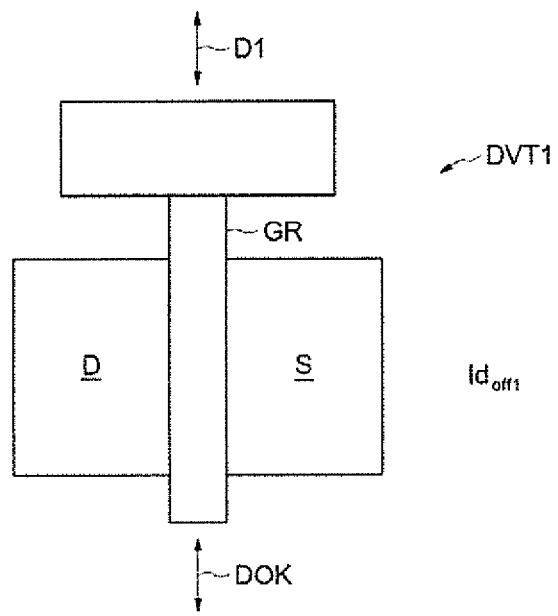
FIGS. 13 and 14 are schematics of test devices of the controller.
Figure 14:
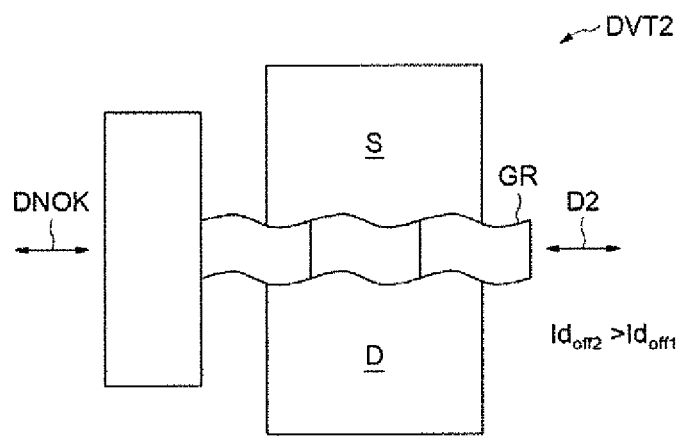

Whereas in the embodiment which has just been described, the test devices were transistors different from the transistors DV1 and DV2, that is to say different from the thin gate oxide transistors, it is possible, as illustrated in FIGS. 13 and 14, to also use thin gate oxide transistors as test transistors DVT1 and DVT2.

More precisely, the first test transistor DVT1 will be oriented in the direction D1, which is assumed here to be the direction DOK corresponding to a usable character of a thin gate oxide transistor. Such a transistor exhibits a leakage current $Id_{off1}$.

For its part, the test transistor DVT2 is oriented in the direction D2, which is assumed here to be the direction DNOK leading to an unusable character of a thin gate oxide transistor. Indeed, in this case, the lithography constraints lead to a gate GR exhibiting a greater roughness than the roughness of the gate GR of the transistor DVT1.

This consequently results in a greater leakage current $Id_{off2}$ of the transistor DVT2 than the leakage current $Id_{off1}$ of the transistor DVT1.

This time it is this electrical parameter, which will be used by the detector 11 to determine that one of the two transistors DV1 and DV2 which is oriented in the appropriate orientation.

In practice, it will be possible to use a diagram analogous to that illustrated in FIGS. 11 and 12 with the gate and the source of each test transistor DVT1 and DVT2 linked to ground and the drain linked to the supply voltage Vdd by way of the resistors R1 and R2.

Figure 15:
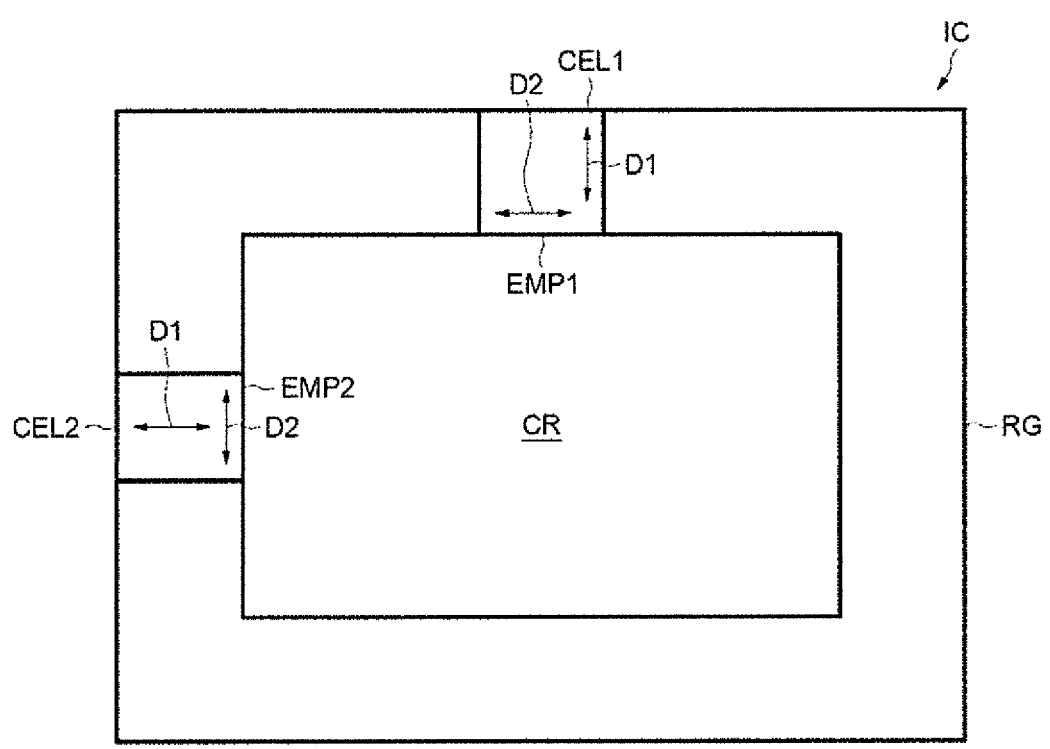
FIG. 15 is a block diagram of an integrated circuit having a rectangular annulus.

FIG. 15 illustrates a rectangular annulus RG comprising a plurality of integrated cells CEL of the type of those which have just been described. The rectangular annulus RG surrounds the core CR of the integrated circuit IC.

Also it is seen that according to the location EMP1 or EMP2 of a cell CEL1 or CEL2, the correct direction of orientation for the thin gate oxide transistors will not be the same. Thus, if the direction D1 is, for example, the direction DOK for the cell CELL, this direction D1 will then be the direction DNOK for the cell CEL2. On the other hand, this time it is the direction D2, which will be the direction DNOK for the cell CEL2, whereas it was not for the cell CEL1.

The invention claimed is:

1. An integrated circuit comprising:
    at least one integrated cell disposed at a location of the integrated circuit;
    a multiplexer coupled to at least one site of the integrated cell;
    first and second integrated devices coupled to the multiplexer and respectively oriented in two directions of orientation, the first integrated device being usable because of the first integrated device's direction of orientation and the second integrated device being unusable because of the second integrated device's direction of orientation; and
    a controller comprising two integrated test devices separate from the first and second integrated devices and respectively oriented in the two directions of orientation, the two integrated test devices being usable in each of the two directions of orientation, the controller being configured to detect a usability of the first integrated device and control the multiplexer to couple the first integrated device electrically to the at least one site.

2. The integrated circuit according to claim 1, wherein the controller comprises:
    a detection circuit having the two integrated test devices respectively oriented in the two directions of orientation, each integrated test device comprising an element exhibiting a characteristic according to the direction of orientation and representative of a usable or non-usable character of the first and second integrated devices; and
    a detector configured to analyze the characteristic of the element of each of the two integrated test devices and to deliver a control signal to the multiplexer.

3. The integrated circuit according to claim 2, wherein the characteristic of the element of each of the two integrated test devices comprises an electrical parameter.

4. The integrated circuit according to claim 1, wherein the two directions of orientation are orthogonal.

5. The integrated circuit according to claim 1, wherein the first and second integrated devices comprise thin gate oxide MOS transistors, a longitudinal direction of each gate defining a direction of orientation of each thin gate oxide MOS transistor.

6. The integrated circuit according to claim 5, wherein each integrated test device comprises a thick gate oxide MOS transistor, a longitudinal direction of each gate defining a direction of orientation of the thick gate oxide MOS transistor, and the element comprises a doped zone having a part extending under the gate of the thick gate oxide MOS transistor, the characteristic being a dimension of the part measured in a direction of a length of a channel.

7. The integrated circuit according to claim 3, wherein the electrical parameter comprises a threshold voltage of each integrated test device, and the detector is configured to detect one of the test integrated test devices which exhibits the highest threshold voltage, and to deliver the control signal to the multiplexer selecting the integrated device having the same direction of orientation as that of the integrated test device exhibiting the highest threshold voltage.

8. The integrated circuit according to claim 2, wherein the element comprises a gate of each integrated test device, the characteristic being a roughness of the gate.

9. The integrated circuit according to claim 3, wherein the electrical parameter comprises a leakage current of each integrated test device, and the detector is configured to detect one of the two integrated test devices which exhibits the smallest leakage current, and to deliver to the multiplexer a control signal selecting the integrated device having the same direction of orientation as that of the integrated test device exhibiting the smallest leakage current.

10. The integrated circuit according to claim 1, wherein the at least one integrated cell comprises a plurality thereof arranged in a rectangular annulus defining input/output cells of the integrated circuit.

11. A method of fabricating an integrated circuit comprising at least one integrated cell disposed at a location of the integrated circuit, a multiplexer coupled to at least one site of the integrated cell, first and second integrated devices coupled to the multiplexer and respectively oriented in two directions of orientation, a controller to control the multiplexer, the first integrated device being usable because of its direction of orientation and the second integrated device being unusable because of its direction of orientation, the method comprising:
    detecting the first integrated device; and
    controlling, with the controller, the multiplexer to couple the first integrated device electrically to the at least one site, the controller comprising two integrated test devices separate from the first and second integrated devices and respectively oriented in the two directions of orientation, the two integrated test devices being usable in each of the two directions of orientation.

12. The method according to claim 11, wherein the controller comprises a detection circuit having the two integrated test devices respectively oriented in the two directions of orientation, each integrated test device comprising an element exhibiting a characteristic according to the direction of orientation and representative of a usable or non-usable character of the first and second integrated devices.

13. The method according to claim 12, wherein the characteristic of the element of each of the two integrated test devices comprises an electrical parameter.

14. The method according to claim 13, wherein the two integrated test devices are different from the first integrated device and usable in the two directions of orientation.

15. The method according to claim 13, further comprising:
    detecting one of the test integrated test devices which exhibits the highest threshold voltage; and
    delivering the control signal to the multiplexer selecting the integrated device having the same direction of orientation as that of the integrated test device exhibiting the highest threshold voltage.

16. An integrated circuit comprising:
    at least one integrated cell having at least one site;
    a multiplexer coupled to the at least one site;

first and second integrated devices coupled to the multiplexer and each oriented in a different direction of orientation, the first integrated device being operable because of the first integrated device's direction of orientation and the second integrated device being inoperable because of the second integrated device's direction of orientation; and a controller coupled to the multiplexer and configured to couple one integrated device of the first and second integrated devices to the at least one site, the controller comprising, two integrated test devices separate from the first and second integrated devices and respectively oriented in the two directions of orientation, the two integrated test devices being operable in each of the two directions of orientation, and a detector coupled to the two integrated test devices and configured to detect which one of the two integrated test devices has a highest threshold voltage, and to transmit to the multiplexer a control signal selecting one of the first and second integrated devices having a same direction of orientation as that of the integrated test device having the highest threshold voltage.

17. The integrated circuit according to claim 16, wherein each integrated test device comprises a thick gate oxide MOS transistor, a longitudinal direction of each gate defining a direction of orientation of the thick gate oxide MOS transistor.

* * * * *